(12) United States Patent
Yeh

(10) Patent No.: US 8,998,625 B2
(45) Date of Patent: Apr. 7, 2015

(54) ELECTRICAL CONNECTOR FOR SELF LOADING ELECTRONIC PACKAGE

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 29 days.

(21) Appl. No.: 13/975,397

(22) Filed: Aug. 26, 2013

(65) Prior Publication Data
US 2014/0057470 A1   Feb. 27, 2014

(30) Foreign Application Priority Data

Aug. 27, 2012  (TW) .................................. 101130938

(51) Int. Cl.
| | |
|---|---|
| H01R 13/44 | (2006.01) |
| H01R 13/62 | (2006.01) |
| H01L 23/32 | (2006.01) |
| H01L 23/00 | (2006.01) |
| H05K 7/10 | (2006.01) |

(52) U.S. Cl.
CPC ............... *H01R 13/62* (2013.01); *H01L 23/32* (2013.01); *H01L 24/00* (2013.01); *H05K 7/1061* (2013.01); *Y10S 439/94* (2013.01)

(58) Field of Classification Search
USPC .................................... 439/41, 135, 136, 940
See application file for complete search history.

(56) References Cited

U.S. PATENT DOCUMENTS

| | | | | |
|---|---|---|---|---|
| 6,413,111 B1 * | 7/2002 | Pickles et al. | ................. | 439/342 |
| 6,478,588 B1 * | 11/2002 | Howell et al. | ................. | 439/135 |
| 6,533,592 B1 * | 3/2003 | Chen et al. | .................... | 439/135 |
| 6,554,624 B1 * | 4/2003 | Yu | ................. | 439/135 |
| 6,554,625 B1 * | 4/2003 | Liao et al. | ..................... | 439/135 |
| 6,558,174 B1 * | 5/2003 | Hou | ............. | 439/135 |
| 6,561,825 B1 * | 5/2003 | McHugh et al. | ............. | 439/135 |
| 6,572,383 B1 * | 6/2003 | Yu | ................. | 439/41 |
| 6,626,691 B2 * | 9/2003 | Yu | ................. | 439/342 |
| 6,655,970 B2 * | 12/2003 | Tsai | ............................. | 439/135 |
| 6,753,474 B2 * | 6/2004 | Trout | ............. | 174/66 |
| 6,783,369 B2 * | 8/2004 | Zhang | ............. | 439/41 |
| 6,846,190 B2 * | 1/2005 | Abe et al. | ..................... | 439/135 |
| 6,875,022 B2 * | 4/2005 | Ma | ................ | 439/41 |
| 6,877,990 B2 * | 4/2005 | Liao et al. | ..................... | 439/41 |
| 6,899,553 B2 * | 5/2005 | Ma et al. | ..................... | 439/135 |
| 6,905,353 B2 * | 6/2005 | Ma et al. | ..................... | 439/135 |
| 6,939,140 B2 * | 9/2005 | Liao | ................. | 439/41 |
| 6,945,798 B2 * | 9/2005 | McClellan et al. | ........... | 439/135 |
| 6,971,890 B2 * | 12/2005 | Ma | .................... | 439/135 |
| 6,974,346 B2 * | 12/2005 | Liao | .................... | 439/342 |
| 7,001,197 B2 | 2/2006 | Shirai et al. | | |
| 7,004,768 B2 * | 2/2006 | Ma et al. | ..................... | 439/135 |
| 7,014,488 B2 * | 3/2006 | Stone | ............. | 439/331 |
| 7,029,295 B2 * | 4/2006 | Liao | ............. | 439/135 |
| 7,033,183 B2 * | 4/2006 | Ma et al. | ......................... | 439/41 |

(Continued)

*Primary Examiner* — Ross Gushi
(74) *Attorney, Agent, or Firm* — Wei Te Chung; Ming Chieh Chang

(57) ABSTRACT

An electrical connector for use with an electronic package, includes an insulative housing with a number of periphery sidewalls formed with a cavity. A guiding member is located upon the insulative housing, and includes a guiding frame with an opening and a sliding plate moveable mounted in the guiding frame. The electronic package is supported by the guiding member and pulled the sliding plate away from the guiding frame to let the electronic package enter into the cavity by passing through the opening.

20 Claims, 7 Drawing Sheets

(56) References Cited

U.S. PATENT DOCUMENTS

| | | | |
|---|---|---|---|
| 7,033,188 B2 * | 4/2006 | Ma | 439/135 |
| 7,059,863 B2 * | 6/2006 | Ma | 439/41 |
| 7,070,427 B2 * | 7/2006 | Liao et al. | 439/135 |
| 7,070,428 B2 * | 7/2006 | Ma | 439/135 |
| 7,080,986 B2 * | 7/2006 | Ma | 439/41 |
| 7,090,517 B2 * | 8/2006 | Ma | 439/135 |
| 7,112,066 B2 * | 9/2006 | Liao et al. | 439/41 |
| 7,121,844 B2 * | 10/2006 | Ma | 439/73 |
| 7,140,890 B1 * | 11/2006 | Ju | 439/135 |
| 7,147,508 B1 * | 12/2006 | Ju | 439/521 |
| 7,165,988 B2 * | 1/2007 | Ma et al. | 439/331 |
| 7,208,675 B2 * | 4/2007 | Horng | 174/377 |
| 7,232,318 B2 * | 6/2007 | Wang | 439/135 |
| 7,264,487 B2 * | 9/2007 | Liao | 439/135 |
| 7,367,822 B2 * | 5/2008 | Ma | 439/135 |
| 7,390,202 B2 * | 6/2008 | Ma et al. | 439/135 |
| 7,404,721 B2 * | 7/2008 | Ju et al. | 439/135 |
| 7,429,181 B2 * | 9/2008 | Liao | 439/135 |
| 7,429,182 B1 * | 9/2008 | Zheng et al. | 439/135 |
| 7,445,454 B2 * | 11/2008 | Szu et al. | 439/41 |
| 7,455,526 B1 * | 11/2008 | Ila et al. | 439/41 |
| 7,473,119 B2 * | 1/2009 | Hsieh et al. | 439/342 |
| 7,473,120 B2 * | 1/2009 | Zhang et al. | 439/342 |
| 7,503,781 B2 * | 3/2009 | Chang | 439/135 |
| 7,517,229 B2 * | 4/2009 | Ma | 439/73 |
| 7,524,199 B2 * | 4/2009 | Zheng et al. | 439/135 |
| 7,527,507 B2 * | 5/2009 | Liao et al. | 439/135 |
| 7,530,822 B2 * | 5/2009 | Liao | 439/135 |
| 7,534,114 B2 * | 5/2009 | Liao | 439/135 |
| 7,566,225 B1 * | 7/2009 | Ho | 439/41 |
| 7,575,449 B1 * | 8/2009 | Cai | 439/135 |
| 7,578,684 B2 * | 8/2009 | Liao | 439/135 |
| 7,628,615 B2 * | 12/2009 | Lin et al. | 439/41 |
| 7,632,115 B1 * | 12/2009 | Polnyi | 439/135 |
| 7,708,571 B2 * | 5/2010 | Terhune et al. | 439/135 |
| 7,753,687 B2 * | 7/2010 | Fan | 439/41 |
| 7,762,823 B2 * | 7/2010 | Zhang | 439/135 |
| 7,828,565 B2 * | 11/2010 | Ma et al. | 439/135 |
| 7,866,985 B2 * | 1/2011 | Hsu | 439/41 |
| 7,883,345 B2 * | 2/2011 | Yeh et al. | 439/135 |
| 7,955,086 B1 * | 6/2011 | Howell | 439/41 |
| 7,972,153 B1 * | 7/2011 | Cheng et al. | 439/135 |
| 7,985,084 B2 * | 7/2011 | Chien | 439/135 |
| 8,052,439 B2 * | 11/2011 | Fan et al. | 439/135 |
| 8,137,121 B2 * | 3/2012 | Dai | 439/135 |
| 8,142,201 B2 * | 3/2012 | Fan | 439/41 |
| 8,206,158 B2 * | 6/2012 | Hsu et al. | 439/41 |
| 8,257,098 B2 * | 9/2012 | Yeh | 439/135 |
| 8,439,693 B2 * | 5/2013 | Yeh et al. | 439/135 |
| 8,439,694 B2 * | 5/2013 | Yeh et al. | 439/135 |
| 8,747,120 B2 * | 6/2014 | Terhune, IV | 439/41 |
| 8,905,765 B2 * | 12/2014 | Yeh | 439/73 |
| 2004/0048495 A1 * | 3/2004 | Lei et al. | 439/41 |
| 2004/0266233 A1 * | 12/2004 | Huang | 439/135 |
| 2005/0009377 A1 * | 1/2005 | Liao | 439/41 |
| 2005/0032397 A1 * | 2/2005 | Huang | 439/41 |
| 2005/0090134 A1 * | 4/2005 | Liao et al. | 439/135 |
| 2005/0090136 A1 * | 4/2005 | Liao et al. | 439/331 |
| 2005/0130472 A1 * | 6/2005 | Hou | 439/135 |
| 2006/0116015 A1 * | 6/2006 | Ju | 439/331 |
| 2007/0054532 A1 * | 3/2007 | Ho | 439/331 |
| 2007/0155206 A1 * | 7/2007 | Fan | 439/135 |
| 2007/0238327 A1 * | 10/2007 | Hsu | 439/70 |
| 2008/0102665 A1 * | 5/2008 | Fan | 439/135 |
| 2008/0146045 A1 * | 6/2008 | Chang | 439/41 |
| 2008/0153323 A1 * | 6/2008 | Ju et al. | 439/73 |
| 2008/0160814 A1 * | 7/2008 | Howell | 439/331 |
| 2009/0246989 A1 * | 10/2009 | Ma et al. | 439/135 |
| 2010/0029107 A1 * | 2/2010 | Yeh et al. | 439/135 |
| 2010/0029108 A1 * | 2/2010 | Fan | 439/135 |
| 2010/0087073 A1 * | 4/2010 | Fan et al. | 439/76.1 |
| 2011/0177709 A1 * | 7/2011 | Yeh | 439/342 |
| 2012/0108096 A1 * | 5/2012 | Yeh | 439/345 |
| 2012/0142209 A1 * | 6/2012 | Yeh et al. | 439/345 |
| 2012/0156919 A1 * | 6/2012 | Yeh et al. | 439/370 |
| 2014/0011377 A1 * | 1/2014 | Yeh | 439/73 |
| 2014/0057470 A1 * | 2/2014 | Yeh | 439/159 |
| 2014/0134880 A1 * | 5/2014 | Yeh | 439/620.15 |
| 2014/0199860 A1 * | 7/2014 | Liang et al. | 439/78 |

* cited by examiner

ELECTRICAL CONNECTOR FOR SELF LOADING ELECTRONIC PACKAGE

BACKGROUND OF THE INVENTION

1. Field of the Invention

The present invention relates to an electrical connector, and more particularly to the electrical connector having guiding member to guide an electronic package mounted thereto to prevent contacts of the electrical connector from damaging.

2. Description of Related Art

U.S. Pat. No. 7,001,197 issued to Shiral et al. on Feb. 26, 2006 discloses a land grid array (LGA) socket. The LGA socket comprises an insulative housing with a plurality of contacts, a cover member pivotally mounted on a first end of the insulative housing. When the cover is opened, an LGA package is loaded directly on top beams of the contacts by manual operation. The contact beams are exposed out of the top surface of the insulative housing, these contact beams are susceptible to damage during loading the LGA package. The beams may be broken, bent, or deformed resulted in misalignment of the beams with respect to the package.

Thus, a need exists for an LGA socket that reduces the susceptibility of the LGA surface mount contacts to damage.

SUMMARY OF THE INVENTION

An object of the present invention is to provide an electrical connector having guiding member to guide an electronic package mounted thereto to prevent contacts of the electrical connector from damaging.

According to one aspect of the present invention, an electrical connector for use with an electronic package, comprises an insulative housing with a plurality of periphery sidewalls formed with a cavity. A guiding member is located upon the insulative housing, and includes a guiding frame with an opening and a sliding plate moveable mounted in the guiding frame. The electronic package is supported by the guiding member and pulled the sliding plate away from the guiding frame to let the electronic package enter into the cavity by passing through the opening.

According to another aspect of the present invention, an electrical connector, comprises an insulative housing with a plurality of periphery sidewalls formed with a cavity. A plurality of contacts is received in the cavity. A guiding member includes a guiding frame assembled to the insulative housing and a sliding plate. The guiding frame is configured to allow the sliding plate to be withdrawn therefrom in a transverse direction.

Other objects, advantages and novel features of the invention will become more apparent from the following detailed description of a preferred embodiment when taken in conjunction with the accompanying drawings.

DETAILED DESCRIPTION OF THE INVENTION

Referring to FIGS. 1 to 7, an electrical connector used to electrically connect an electronic package 4 to a printed circuit board (not shown), comprises an insulative housing 2 with a plurality of contacts 1 and a guiding or loading member 3.

Figure 1:
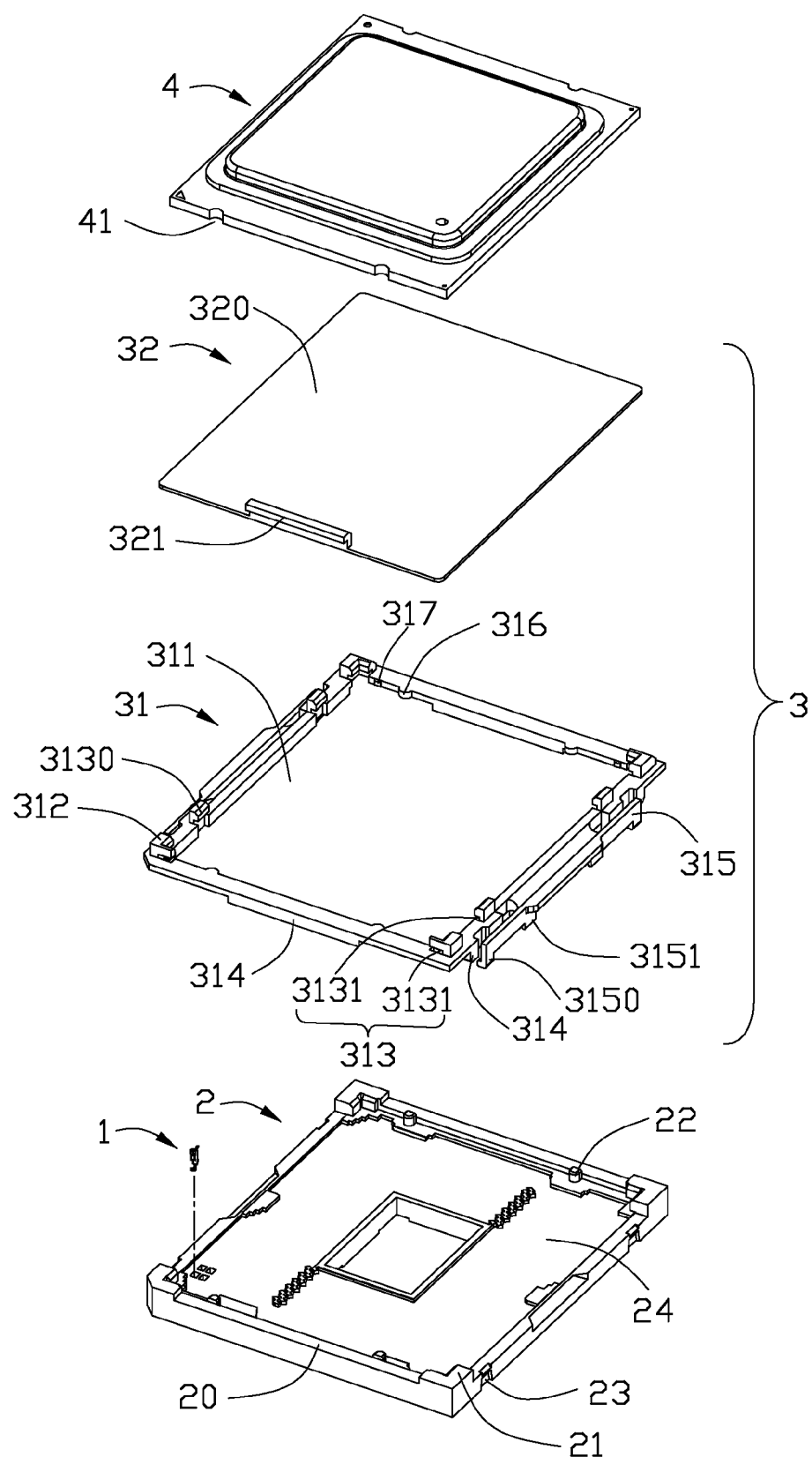
FIG. 1 is an exploded, perspective view of an electrical connector in accordance with the present invention, and an electronic package is showing.

Referring to FIG. 1, the insulative housing 2 has a cavity 24 to receive the contacts 1, each contacts 1 has a contact beam extending out of a top surface of the insualtive housing 2. A plurality of sidewalls 20 extend upwardly from periphery of the cavity 24. A plurality of datums 21 are disposed at corners of the insulative housing 2 and higher than the sidewalls 20 for restraining the electronic package 4. A plurality of posts 22 are disposed inside of the sidewalls 20 to cooperate with corresponding recesses of the electronic package 4, and a plurality of cutouts 23 are defined on outside of the sidewalls 20 for cooperating with the guiding member 3.

Figure 2:
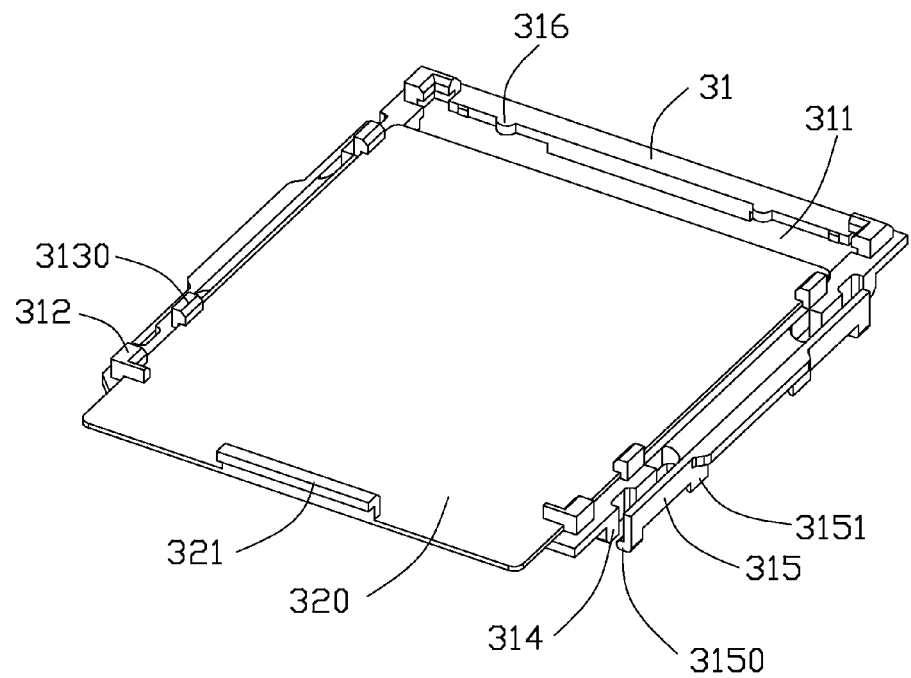
FIG. 2 is a perspective view of a guiding member.

Referring to FIGS. 1 and 2, the guiding member 3 assembled to the insulative housing 2, comprises a guiding frame 31 and a sliding plate 32. The guiding frame 31 against the sidewalls 20 and the datums 21, and defines an opening 311 having a substantially size with the cavity 24. The guiding frame 31 has four restraining portions 312 extending upward for restraining the electronic package 4. The guiding frame 31 has a plurality of protrusions 3130 located opposite sides thereon. The protrusions 3130 and restraining portions 31 each defines a recess 3131 to form two opposite runners 313 at opposite sides. A pair opposite sides of the guiding frame 31 has supporting portions 314 extending downwardly to against the sidewalls 20 of the insulative housing 2 for preventing the guiding frame from breaking. Another pair sides of the guiding frame 31 has latches 315 mating with the insualtive housing 2. Each latch 315 includes hooks 3150 to engage with corresponding cutouts 23 and extending portions 3151 to move along the outside of the sidewalls 20 of the insulative housing 2. The guiding frame 31 further has a plurality of tabs 316 and ribs 317 extending toward the opening 311. The tabs 316 have the same function with the posts 22.

The sliding plate 32 includes a solid body 320 with a planar configuration and a handle portion 321 extending upwardly from the body 320. The body 320 inserts into the runners 313 and can move along the runners 313 to cover the opening 311.

Figure 3:
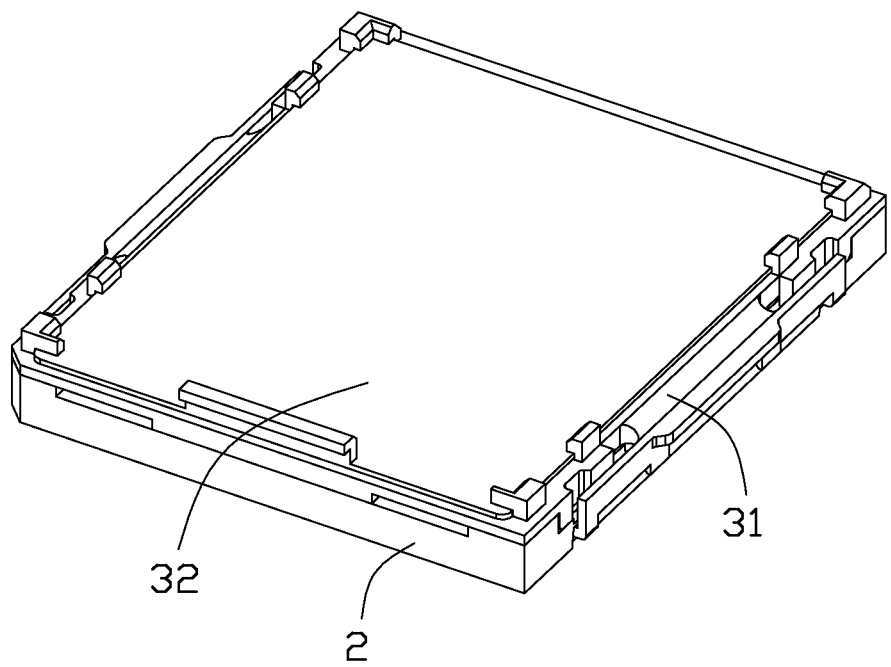
FIG. 3 is an assembled view of the electrical connector.
Figure 4:
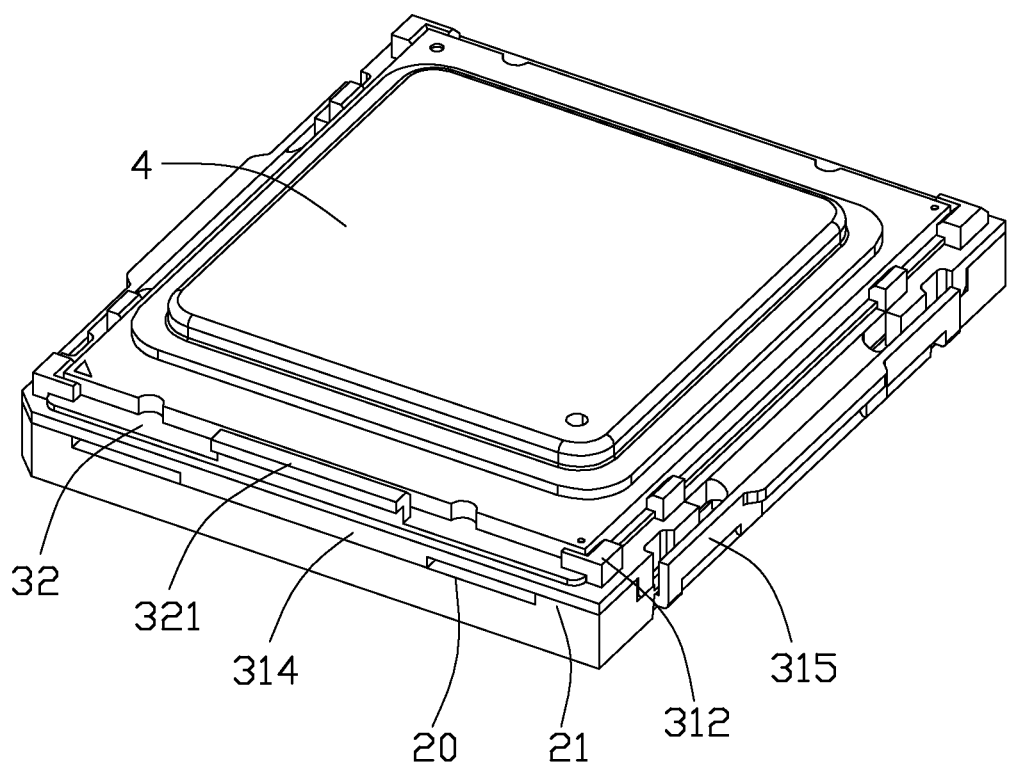
FIG. 4 is assembling process view showing a second step of the electronic package assembling on the electrical connector.
Figure 5:
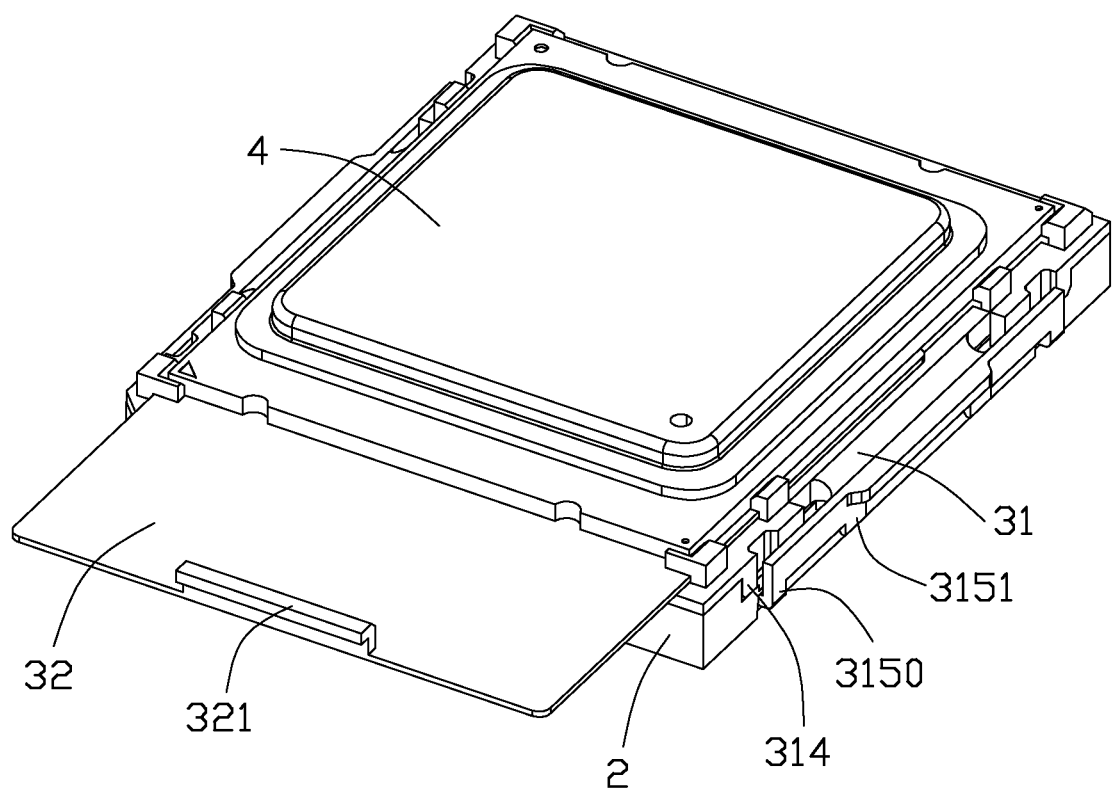
FIG. 5 is assembling process view showing a third step of the electronic package assembling on the electrical connector.
Figure 6:
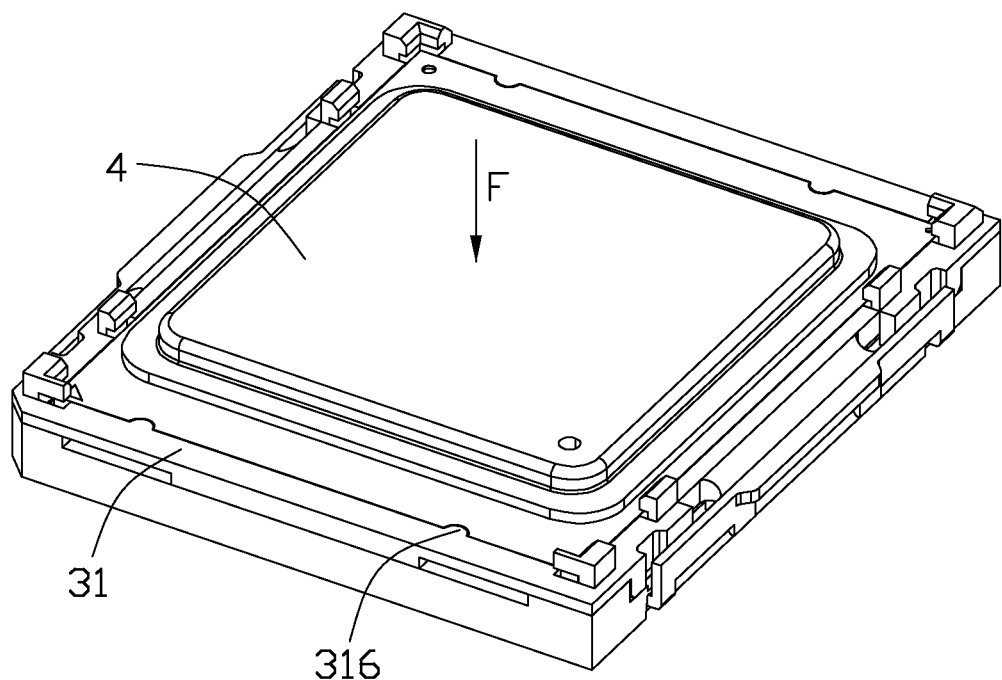
FIG. 6 is assembling process view showing a fourth step of the electronic package assembling on the electrical connector.
Figure 7:
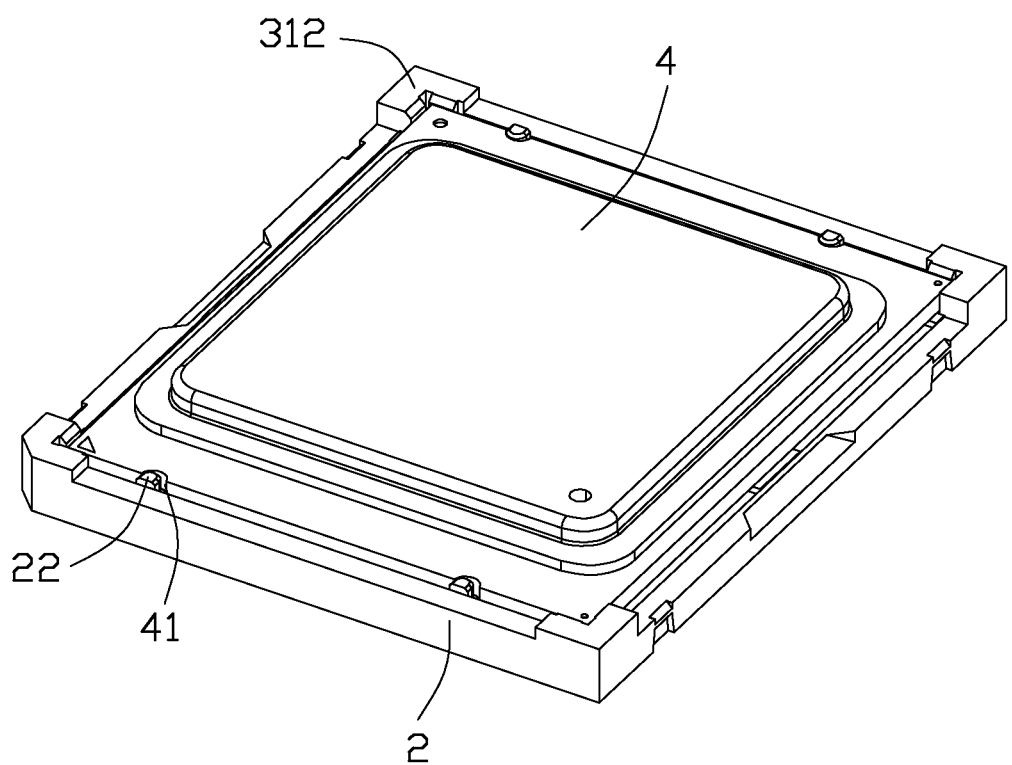
FIG. 7 is assembling process view showing a fifth step of the electronic package assembling on the electrical connector.

The assembling method of the electrical connector for connecting the electronic package 4 and the contacts 1 comprises steps as follows: (1). Referring to FIG. 3, assemble the guiding member 3 to the insulative housing 2 after the sliding plate 32 assemble to the guiding frame 31. (2). Referring to FIG. 4, assemble the electronic package 4 to the guiding member 3, at that condition, the restraining portions 312 of the guiding member 3 restrain the electronic package 4 and the sliding plate 32 supports the electronic package 4. (3). Referring to FIG. 5, grasp the handle portion 321 of the sliding plate 32 and withdraw the sliding plate 32 between the guiding frame 31 and the electronic package 4, then the electronic package 4 will move downwardly till clamped by the ribs 317. (4). Referring to FIG. 6, exert a small force F on a top surface of the electronic package 4 to let the electronic package 4 located in the cavity 24 of the insulative housing 2 to establish a direct connection with the contacts 1. (5). Referring to FIG. 7, at last step, remove the guiding frame 31 from the insulative housing 2. Wherein, the step (1) could change orders with the step (2).

The key structure of the prevent invention is using the guiding member 3 to carry the electronic package 4 mounted to the insulative housing 2. The sliding plate 32 of the guiding member 3 covered upon the contacts 1 can also protect contacts 1 from damaging and polluting by dust. In this invention, the position of the guiding member 3 is not necessarily assembled to the insulative housing 2, which also can be assembled to the printed circuit board, but located upon the insulative housing 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for use with an electronic package, comprising:
    an insulative housing with a plurality of periphery sidewalls formed with a cavity;
    a guiding member located upon the insulative housing and including a guiding frame with an opening and a sliding plate moveable mounted in the guiding frame; wherein
    the electronic package is supported by the guiding member, and in response to removal of the sliding plate away from the guiding frame, the electronic package enters into the cavity by passing through the opening.

2. The electrical connector as claimed in claim 1, wherein the guiding frame has four restraining portions at corners thereof.

3. The electrical connector as claimed in claim 2, wherein the guiding frame has a pair of runners to receive the sliding plate.

4. The electrical connector as claimed in claim 3, wherein the runner is formed by a plurality of discontinuity recesses which are defined on the restraining portions and a plurality of protrusions disposed on the guiding frame.

5. The electrical connector as claimed in claim 1, wherein the sliding plate includes a solid body with a planar configuration and a handle portion extending upwardly from the body.

6. The electrical connector as claimed in claim 5, wherein the opening of the guiding frame is covered wholly by the solid body.

7. The electrical connector as claimed in claim 1, wherein the sidewalls of the insulative housing defines a plurality of cutouts and the guiding frame has corresponding latches to engage with the cutouts.

8. The electrical connector as claimed in claim 1, wherein the guiding frame formed with a plurality of ribs and tabs extending toward the opening.

9. An electrical connector comprising:
    an insulative housing with a plurality of periphery sidewalls formed with a cavity;
    a plurality of contacts extending in the cavity; and
    a guiding member including a guiding frame assembled to the insulative housing, and a sliding plate associated with the guiding frame; wherein
    the guiding frame is configured to allow the sliding plate to be withdrawn therefrom in a transverse direction.

10. The electrical connector as claimed in claim 9, wherein the guiding frame defines an opening having a substantially size with the cavity.

11. The electrical connector as claimed in claim 9, wherein the guiding frame is configured with a pair of parallel runners to allow the sliding plate to be withdrawn.

12. The electrical connector as claimed in claim 9, wherein the insulative housing has four datums at corners thereof for supporting the guiding frame.

13. The electrical connector as claimed in claim 9, wherein a plurality of supporting portions extend downwardly from the guiding frame to against the sidewalls of the insulative housing.

14. An electrical connector assembly comprising:
    an insulative housing defining an upward receiving cavity for receiving an electronic package therein in a vertical direction;
    a plurality of contacts disposed in the housing with contacting sections exposed in the receiving cavity; and
    a loading member including a guiding frame disassembly assembled onto the housing and a sliding plate disassembly assembled upon the guiding frame along a transverse direction perpendicular to said vertical direction; wherein
    the sliding plate performs not only a pick-up and shielding function for mounting the housing and the associated contacts upon a printed circuit board when the sliding plate is associated with the guiding frame, but also a guiding function during loading the electronic package into the receiving cavity when said sliding plate is removed from the guiding frame.

15. The electrical connector assembly as claimed in claim 14, wherein an opening of the guiding frame is configured to circumferentially restrain the electronic package for guiding the electronic package to move in the vertical direction during loading the electronic package in to the receiving cavity.

16. The electrical connector assembly as claimed in claim 15, wherein said guiding frame further defines around the opening a plurality of protrusions each defining a recess to receive a side edge region of the sliding plate.

17. The electrical connector assembly as claimed in claim 15, wherein an inner edge of each of said protrusions is essentially aligned with a boundary of the opening.

18. The electrical connector assembly as claimed in claim 14, wherein said guiding frame defines around the opening a plurality of semi-circular tabs in alignment with a plurality of posts formed on the housing around said receiving cavity, respectively.

19. The electrical connector assembly as claimed in claim 14, wherein said sliding plate includes a handle portion on one edge.

20. The electrical assembly as claimed in claim 14, wherein said housing defines a plurality of cutouts where deflectable latches of the guiding frame are locked.

* * * * *